United States Patent [19]

Tehrani et al.

[11] Patent Number: 5,742,082

[45] Date of Patent: Apr. 21, 1998

[54] STABLE FET WITH SHIELDING REGION IN THE SUBSTRATE

[75] Inventors: Saied N. Tehrani, Tempe; Jenn-Hwa Huang, Gilbert; Herbert Goronkin, Tempe; Ernest Schirmann; Marino J. Martinez, both of Phoenix, all of Ariz.

[73] Assignee: Motorola, Inc., Schaumburg, Ill.

[21] Appl. No.: 753,312

[22] Filed: Nov. 22, 1996

[51] Int. Cl.$^6$ .................................................. H01L 29/80
[52] U.S. Cl. .......................... 257/280; 257/281; 257/282
[58] Field of Search ................................ 257/280, 281, 257/282, 192, 194, 343, 345

[56] References Cited

U.S. PATENT DOCUMENTS 5,289,015  2/1994  Chirovsky et al. ..................... 257/280

*Primary Examiner*—Minh-Loan Tran
*Attorney, Agent, or Firm*—Eugene A. Parsons

[57] ABSTRACT

A stable FET including a substrate structure with a doped layer formed as a portion of the substrate structure and defining an electrically conductive shielding region adjacent a surface of the substrate structure. A channel region is positioned on the shielding region and includes a plurality of epitaxial layers grown on the surface of the substrate structure in overlying relationship to the doped layer. A drain and a source are positioned on the channel region in spaced relationship from each other with a gate positioned in overlying relationship on the channel region between the drain and source. An externally accessible electrical contact is connected to the shielding region and to the source region to provide a path for the removal of internally generated charges, such as holes.

14 Claims, 3 Drawing Sheets

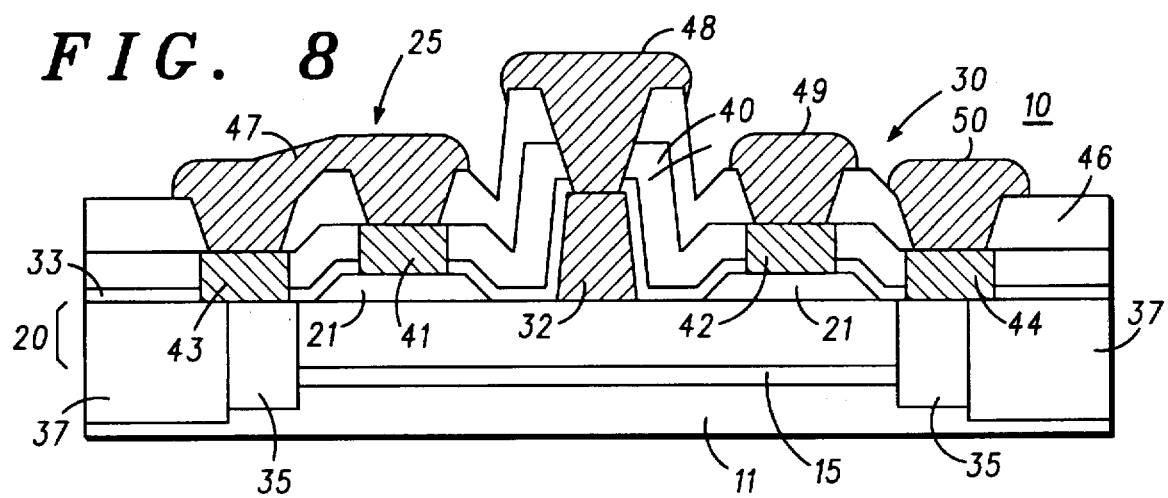
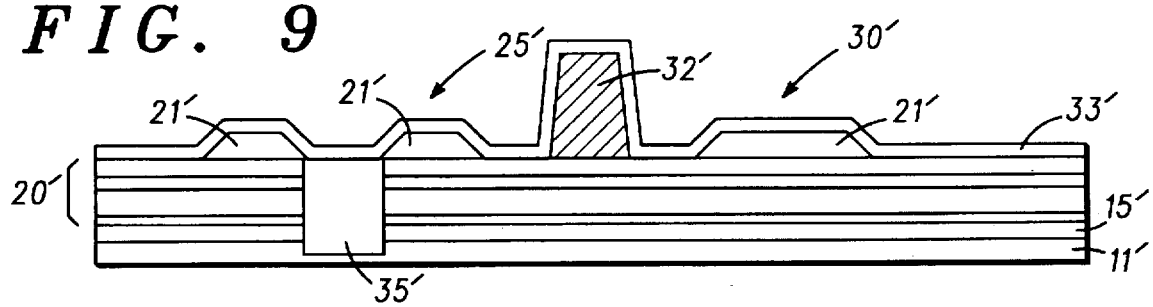
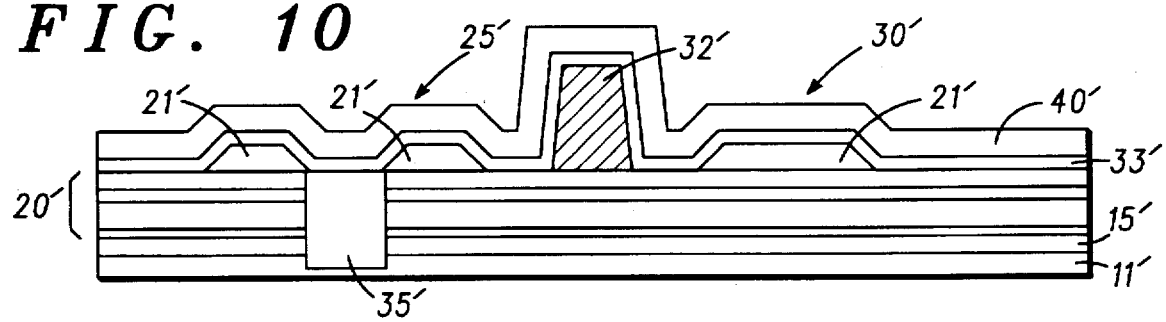
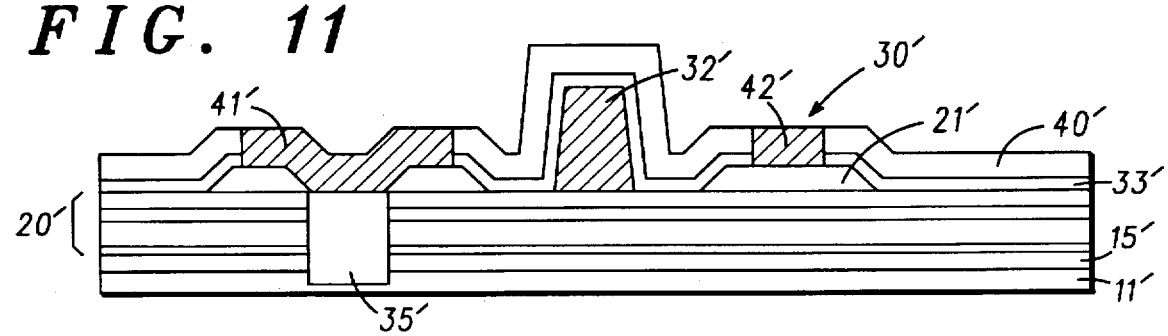

STABLE FET WITH SHIELDING REGION IN THE SUBSTRATE

FIELD OF THE INVENTION

The present invention pertains to field effect transistors and more particularly to field effect transistors with increased stability.

BACKGROUND OF THE INVENTION

Field effect transistors (FETs) are used in a large variety of applications. It has been found, however, that some varieties of FETs have problems in some applications. The gallium arsenide (GaAs) MESFET and heterojunction FET (HFET), for example, when biased into class AB operation (near pinch-off) and used for power applications show a transient effect and in some cases oscillation effects under RF drive.

Oscillations in GaAs and GaAs/AlAs substrates has been observed and reported by many groups. In these studies low frequency oscillations were observed in structures that had two heavily doped contact regions separated by a semi-insulating or lightly doped region. The oscillations were related to trapping and detrapping of the deep levels, like EL2. The current-voltage characteristics of these devices have clearly shown four regions in the log-log scale. The four regions correspond well to the space-charge-limited characteristics that were first proposed by Mott and Gurney for a $n^+$-$n^-$-$n^+$ structure with traps. The four regions are: linear, quadratic (later observed to have negative resistivity in GaAs), trap-filling regimes, and trap-filled regimes. The oscillations were observed when the devices were biased in the quadratic or negative resistance regions.

The FET structures, and especially HFET and MESFET structures, currently used can be divided into two sections or regions. In region one the channel is the main conducive path for the electrons. The channel is open when the device is biased far away from pinch-off in the conductive mode. When the device is biased into pinch-off, or deep into pinch-off, the portion of the device underneath the channel plays a significant role. This portion of the device has a $n^+$-$n^-$(or $p^{--}$)-$n^+$ structure with space-charge-limited characteristics. In order to avoid the oscillation and transient effects, the device has to be designed so that the field generated in the device does not fall in the second region (negative resistance region) of the current-voltage (I-V) characteristics. Two previous methods of accomplishing this are to increase the trap concentration between source and drain under the channel and to increase the spacing between source and drain. The trap concentration method adds some steps to the fabrication process and the increased spacing method produces undesirable frequency characteristics.

It would be highly desirable to provide a FET that eliminates both the transient and oscillation effects and a method of fabrication of the FET.

It is a purpose of the present invention to provide a new and improved stable FET.

It is another purpose of the present invention to provide a new and improved stable FET that eliminates both transient and oscillation effects.

It is still another purpose of the present invention to provide a method of fabricating stable FETs that eliminate both transient and oscillation effects.

SUMMARY OF THE INVENTION

The above problems and others are at least partially solved and the above purposes and others are realized in a stable FET including a substrate structure with an electrically conductive shielding region positioned in the substrate structure. A channel region is positioned on the shielding region and a drain and source are positioned on the channel region in spaced apart relationship with a gate positioned in overlying relationship on the channel region between the drain and source. The source has an externally accessible electrical contact and an externally accessible electrical contact is connected to the shielding region. In a preferred embodiment an implant region is formed through the source region and a single integral externally accessible electrical contact is connected to both the source region and the shielding region.

BRIEF DESCRIPTION OF THE DRAWINGS

Referring to the drawings:

FIGS. 1 through 8 are simplified sectional views illustrating various steps in a process for fabricating FETs in accordance with the present invention; and FIGS. 9 through 11 are simplified sectional views illustrating various steps in another process for fabricating FETs in accordance with the present invention.

DESCRIPTION OF THE PREFERRED EMBODIMENTS

Figure 1:
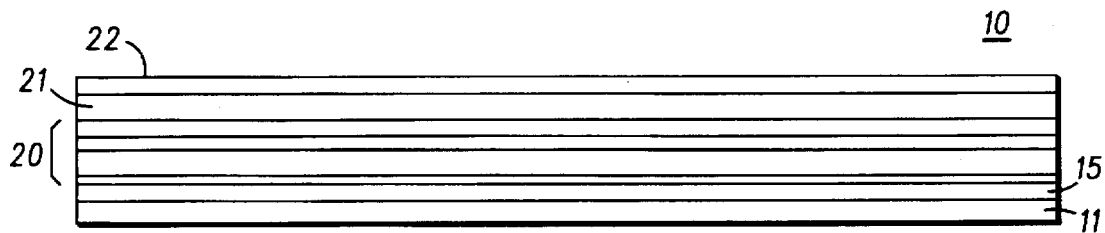

Turning now to the figures, FIGS. 1 through 8 are simplified sectional views illustrating various steps in a process for fabricating a field effect transistor (FET) 10 in accordance with the present invention. Referring specifically to FIG. 1, The fabrication of FET 10 begins with the provision of a substrate structure 11, which includes a supporting substrate and may contain one or more epitaxial layers, e.g. buffer and/or gradient layers, depending upon the specific material utilized and the specific application. Generally, in this specific embodiment, the supporting substrate includes gallium arsenide (GaAs), aluminum arsenide (AlAs), or their alloys.

An electrically conductive shielding region 15 is positioned adjacent to a surface of substrate structure 11 and is generally referred to herein as being a portion of substrate structure 11. Shielding region 15 can be formed in a variety of ways, including but not limited to epitaxially growing a doped layer on substrate structure 11, implanting and annealing to form a doped layer, etc. In this embodiment, shielding region 15 is lightly doped with a P-type impurity to produce a $P^-$ doped layer. It will be understood from the following text and drawings that shielding region 15 extends at least between the source and drain of FET 10.

A channel region 20 is positioned on shielding region 15 by any convenient means. In this embodiment, channel region 20 includes a plurality of epitaxial layers grown on the surface of substrate structure 11 in overlying relationship to shielding region 15. As will be understood by those skilled in the art, channel region 20 may include a single channel layer of semiconductor material or a plurality of layers including, for example, a channel layer having barrier or buffer layers on the lower and upper sides thereof. Also, in this specific embodiment, channel region 20 is lightly doped with N-type impurity to produce an $N^-$ doped layer or layers.

Figure 2:
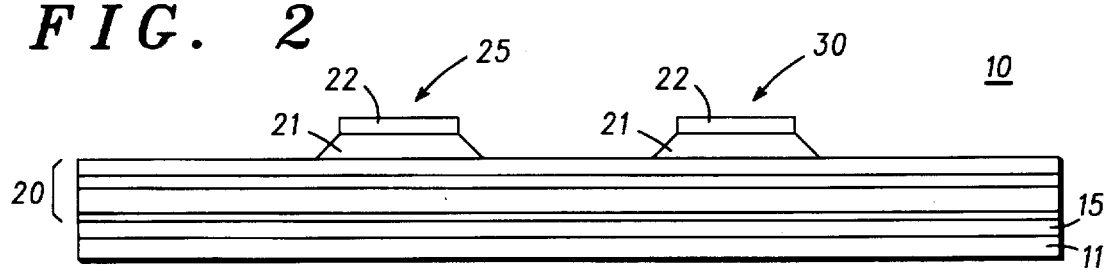

A source and a drain are then formed on channel region 20 in any of a variety of processes. In this preferred fabrication process, a cap layer 21 is positioned on the surface of channel region 20. Cap layer 21 is, for example, a layer of $N^+$ GaAs approximately 1000Å thick and is epitaxially grown on the surface of channel region 20. A layer 22 of hard mask material is positioned on the surface of cap layer 21. In this preferred process, layer 22 is formed of approximately 500Å of silicon nitride (SIN) deposited by some convenient method, such as PECVD or the like. Photoresist and reactive ion etch (RIE) or the like is then used to pattern layer 22, as illustrated in FIG. 2. The patterning of layer 22 is performed to define a source area and a drain area for FET 10.

Figure 3:
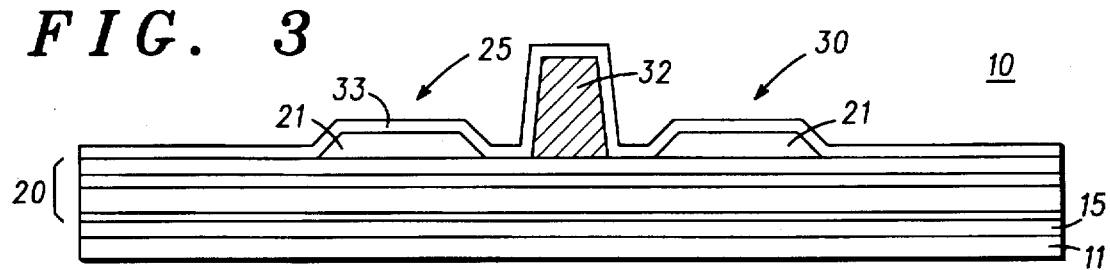

Using patterned layer 22 as a mask, cap layer 21 is etched to form a source 25 and a drain 30 on channel region 20 overlying shielding region 15, as illustrated in FIG. 2. Further, source 25 and drain 30 are positioned in spaced apart relationship to define a gate area therebetween. The remainder of layer 22 is optionally removed either before or during the following processing or, in some applications, may be simply left in place. A gate metal deposition is then performed to form a gate contact 32 between source 25 and drain 30 on channel region 20 overlying shielding region 15, as illustrated in FIG. 3. As will be understood, after deposition of a layer of gate metal standard patterning techniques are utilized to define gate contact 32. A typical gate metal utilized in this process is titanium-tungsten-nitride (TiWN) which is deposited and etched by any of the well known processes. A conformal layer 33 of dielectric material is then deposited over the entire structure, as illustrated in FIG. 3. An anneal process may be performed on the structure, such as a rapid temperature anneal, to cure any crystalline damage that may have occurred during the processing and to form a Shottky contact between gate contact 32 and channel region 20.

Figure 4:
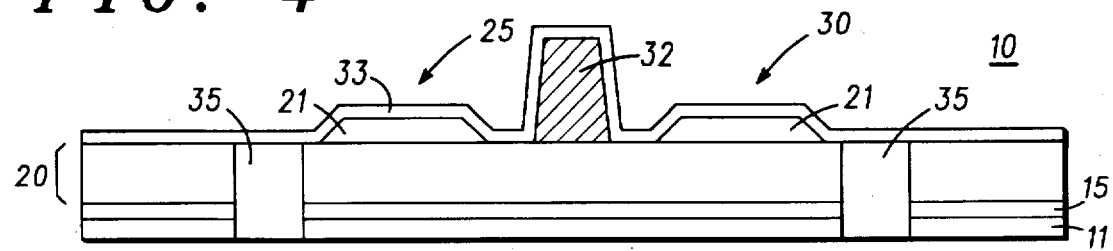

Utilizing photoresist or the like as an implant mask (not shown), externally accessible electrical contact regions 35 are implanted so as to extend through channel region 20 and into contact with shielding region 15, as illustrated in FIG. 4. In this specific embodiment the implants are heavily p-doped regions which are formed by co-implanting, for example, fluorine and beryllium and activating the implant with an anneal at approximately 700° C. This process yields P+ externally accessible electrical contact regions 35 with a doping concentration of approximately 2E19 cm$^{-3}$. Also, two contact regions 35 are provided, one adjacent source 25 and one adjacent drain 30 (near the outer edges) to provide a good electrical path with shielding region 15.

Figure 5:
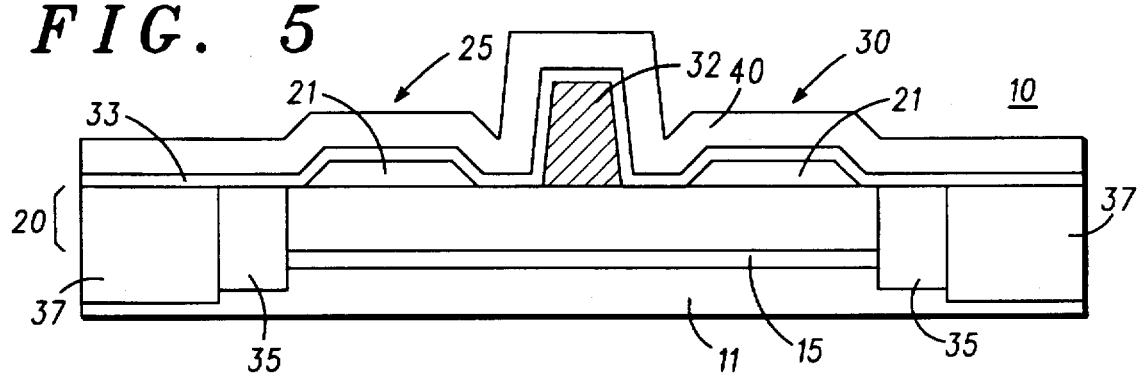
Figure 6:
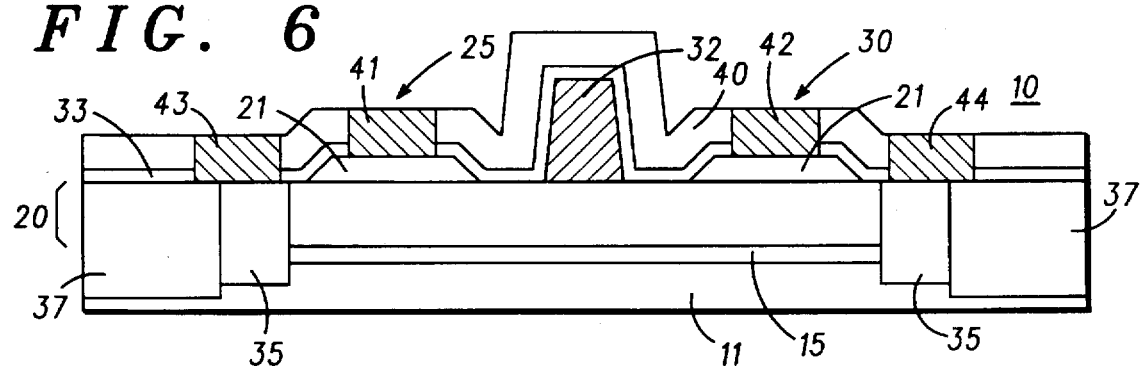

Isolation of FET 10 is accomplished by implanting oxygen regions 37, or the like, adjacent the outer extremities of contact regions 35 in a well known manner. A dielectric or insulating layer 40 (e.g. SiO$_2$ or the like) is then deposited over the entire structure, as illustrated in FIG. 5. Layer 40 is then patterned, by standard photoresist techniques or the like, to define openings therethrough in communication with cap layer 21 at source region 25 and drain region 30. In this embodiment, openings are also formed in communication with contact regions 35. As is illustrated in FIG. 6, contact metal is positioned in the openings and patterned in any of the well known techniques to form an external source contact 41, an external drain contact 42, and external shielding contacts 43 and 44 coupled to shielding region 15 through contact regions 35. The contact metal is any convenient material, such as sputter deposited Ni/Ge/W or the like, that will form a good ohmic contact with the underlying surface in both the P+ and N+ contact regions.

Figure 7:
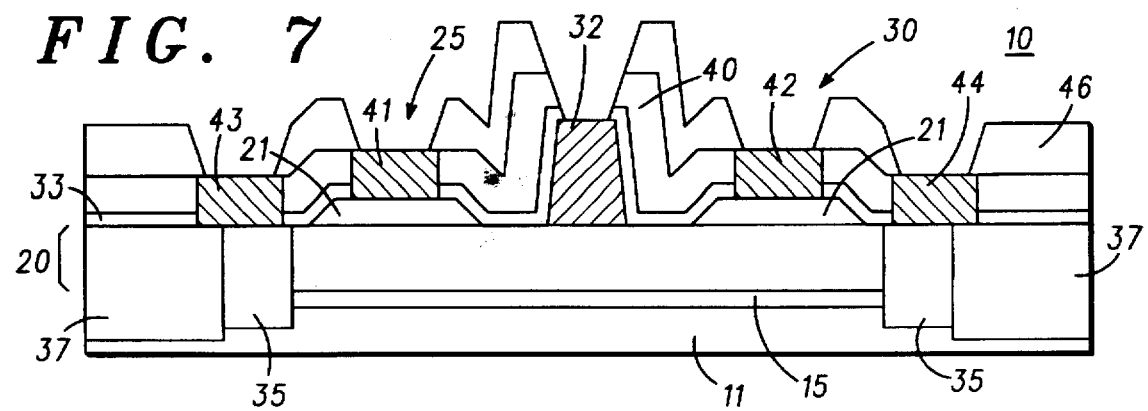

A relatively thick passivation/insulation layer 46 is deposited over the entire structure and patterned by any convenient technique to define openings to contacts 41, 42, 43 and 44, as illustrated in FIG. 7. Any annealing or other processes utilized to complete the formation of FET 10 are performed at this time or at any appropriate times during the fabrication process. To complete FET 10, a final metal deposition is performed to form external source, drain, and gate terminals. The final metal deposition is performed in accordance with standard procedures and, in this embodiment, includes the deposition of TiW/AlCu material (Au and other metals may be included or used instead of) and the patterning thereof to define a source terminal 47 in contact with source contact 41 and external shielding contact 43. Thus, in a single process, shielding region 15 is connected to source 25 and, in normal operation, further connected to ground or other common potential. Also, a gate terminal 48, a drain terminal 49, and a second shielding terminal 50 are provided, as illustrated in FIG. 8.

Turning now to FIGS. 9 through 11, various steps in another fabrication process and a FET 10' embodiment are illustrated. In this process the steps leading to the structure illustrated in FIG. 9 are substantially the same as described in conjunction with FIGS. 1–3, similar components being designated with similar numbers and all numbers having a prime add to indicate a different embodiment. Referring specifically to FIG. 9, the portion of cap layer 21' defining source 25' is originally formed with a central opening therethrough.

Utilizing photoresist or the like as an implant mask (not shown), externally accessible electrical contact region 35' is implanted in the central opening through cap layer 21' so as to extend through channel region 20' and into contact with shielding region 15', as illustrated in FIG. 9. In this specific embodiment the implant is a heavily p-doped region which is formed by co-implanting, for example, fluorine and beryllium and activating the implant with an anneal at approximately 700° C. This process yields P+ externally accessible electrical contact region 35' with a doping concentration of 2E19 cm$^{-3}$. Also, a second contact regions 35' (not shown for convenience) may be provided adjacent drain 30' (near the outer edges) to provide an additional electrical path to shielding region 15'.

Isolation of FET 10' (not shown for convenience) can be accomplished by implanting oxygen regions, or the like, adjacent the outer extremities of source 25' and drain 30' in a well known manner. A dielectric or insulating layer 40' (e.g. SiO$_2$ or the like) is deposited over the entire structure, as illustrated in FIG. 10. Layer 40' is then patterned, by standard photoresist techniques or the like, to define a single opening therethrough in communication with cap layer 21' and contact region 35' at source region 25' and openings therethrough in communication with gate contact 32' and drain region 30'. As is illustrated in FIG. 11, contact metal is positioned in the openings and patterned in any of the well known techniques to form a combined external source and shielding region contact 41' and an external drain contact 42'. The contact metal is any convenient material, such as sputter deposited Ni/Ge/W or the like, that will form a good ohmic contact with the underlying surface in N+ and P+ regions simultaneously.

Therefore, in the embodiment illustrated in FIGS. 9 through 11, the connection of shielding region 15' to source 25' is accomplished with fewer process steps and utilizing less area of substrate 11'. Passivation and external terminals for FET 10' are provided essentially as described in conjunction with FIGS. 7 and 8 above.

Thus, exemplary embodiments of a stable FET have been disclosed, along with fabrication processes. The stable FETs include an electrically conductive shielding region positioned in the substrate structure so as to extend between the source and drain. The shielding region alone will reduce the oscillation and transient effects discussed above. However, providing an external electrical path for the charges (holes) generated in the device during pinch-off will substantially eliminate the oscillation and transient effects. The external connection or connections to the shielding region, for example, provide a path for holes generated at high fields from impact ionization to be extracted from the device, these holes would otherwise be stored close to the source portions of the device. These stored holes produce the transient effects mentioned above, which transient effects are eliminated with the removal of the holes.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A stable FET comprising:

a substrate structure;

an electrically conductive shielding region positioned in the substrate structure, the electrically conductive shielding region including a doped layer of the substrate structure;

a channel region positioned on the shielding region;

a drain positioned on the channel region and overlying the electrically conductive shielding region;

a source positioned on the channel region in spaced relationship from the drain and overlying the electrically conductive shielding region, the source having an externally accessible electrical contact;

a gate positioned in overlying relationship on the channel region between the drain and source and overlying the electrically conductive shielding region; and an externally accessible electrical contact connected to the shielding region, the externally accessible electrical contact including an implant extending through the externally accessible electrical contact of the source, through the channel region and into contact with the shielding region, and the externally accessible electrical contact is formed integrally with the externally accessible electrical contact of the source.

2. A stable FET as claimed in claim 1 wherein the doped layer of the substrate structure includes a doped epitaxial layer grown on a supporting semiconductor substrate.

3. A stable FET as claimed in claim 1 wherein the doped layer of the substrate structure includes an implant into the substrate structure.

4. A stable FET as claimed in claim 1 wherein the doped layer of the substrate structure is doped with p doping and the channel region includes at least one n doped epitaxial layer grown on the substrate structure.

5. A stable FET as claimed in claim 1 wherein the implant extending through the channel region and into contact with the shielding region is doped with p+ doping concentration, the doped layer of the substrate structure is doped with p doping, and the channel region includes at least one n doped epitaxial layer grown on the substrate structure.

6. A stable FET as claimed in claim 1 wherein the implant extending through the channel region and into contact with the shielding region includes a first implant extending through the channel region adjacent the drain and a second implant extending through the channel region adjacent the source.

7. A stable FET as claimed in claim 6 wherein each of the first and second implants has an externally accessible electrical contact connected thereto.

8. A stable FET as claimed in claim 1 wherein the gate includes a metal terminal forming a Schottky contact with the channel region.

9. A stable FET as claimed in claim 1 wherein the substrate structure includes one of GaAs, AlAs, or their alloys.

10. A stable FET comprising:

a substrate structure with a doped layer formed as a portion of the substrate structure and defining an electrically conductive shielding region adjacent a surface of the substrate structure;

a channel region positioned on the shielding region, the channel region including a plurality of epitaxial layers grown on the surface of the substrate structure in overlying relationship to the doped layer defining the electrically conductive shielding region;

a drain positioned on the channel region and overlying the electrically conductive shielding region;

a source positioned on the channel region in spaced relationship from the drain and overlying the electrically conductive shielding region, the source having an externally accessible electrical contact;

a gate positioned on the channel region between the drain and source and overlying the electrically conductive shielding region; and an externally accessible electrical contact connected to the shielding region, the externally accessible electrical contact including an implant extending through the channel region and into contact with the shielding region, the implant extending through the externally accessible electrical contact of the source and formed integrally with the externally accessible electrical contact of the source.

11. A stable FET as claimed in claim 10 wherein the implant extending through the channel region and into contact with the shielding region is doped with p+ doping concentration, the doped layer of the substrate structure is doped with p doping, and the channel region includes at least one n doped epitaxial layer grown on the substrate structure.

12. A stable FET as claimed in claim 10 wherein the implant extending through the channel region and into contact with the shielding region includes a first implant extending through the channel region adjacent the drain and a second implant extending through the channel region adjacent the source.

13. A stable FET as claimed in claim 12 wherein each of the first and second implants has an externally accessible electrical contact connected thereto.

14. A stable FET as claimed in claim 10 wherein the substrate structure includes one of GaAs, AlAs, or their alloys.

* * * * *